(12) United States Patent
Nickel

(10) Patent No.: US 6,429,497 B1
(45) Date of Patent: Aug. 6, 2002

(54) METHOD FOR IMPROVING BREAKDOWN VOLTAGE IN MAGNETIC TUNNEL JUNCTIONS

(75) Inventor: Janice H. Nickel, Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/715,476

(22) Filed: Nov. 18, 2000

(51) Int. Cl.[7] .............................................. H01L 29/76
(52) U.S. Cl. .......................... 257/421; 438/3; 438/240; 365/173
(58) Field of Search ................... 257/295, 421; 438/3, 240; 365/171, 173

(56) References Cited

U.S. PATENT DOCUMENTS

| | | | | |
|---|---|---|---|---|
| 5,688,724 A | * | 11/1997 | Yoon et al. ..................... 438/3 |
| 6,083,764 A | * | 7/2000 | Chen ............................... 438/3 |
| 6,110,751 A | * | 8/2000 | Sato et al. ....................... 438/3 |
| 6,153,898 A | * | 11/2000 | Watanabe et al. ............ 257/295 |
| 6,211,559 B1 | * | 3/2001 | Zhu et al. .................... 257/421 |
| 6,233,172 B1 | * | 5/2001 | Chen et al. .................. 365/173 |
| 6,281,538 B1 | * | 8/2001 | Slaughter .................... 257/295 |
| 6,292,389 B1 | * | 9/2001 | Chen et al. .................. 365/158 |
| 6,331,944 B1 | * | 12/2001 | Monsma et al. ............. 365/171 |
| 2001/0036699 A1 | * | 11/2001 | Slaughter .................... 438/240 |

* cited by examiner

Primary Examiner—Olik Chaudhuri
Assistant Examiner—David S Blum

(57) ABSTRACT

A magnetic tunnel junction includes a tunnel barrier having partially processed (e.g., underoxidized) base material. Such magnetic tunnel junctions may be used in Magnetic Random Access Memory ("MRAM") devices.

13 Claims, 3 Drawing Sheets

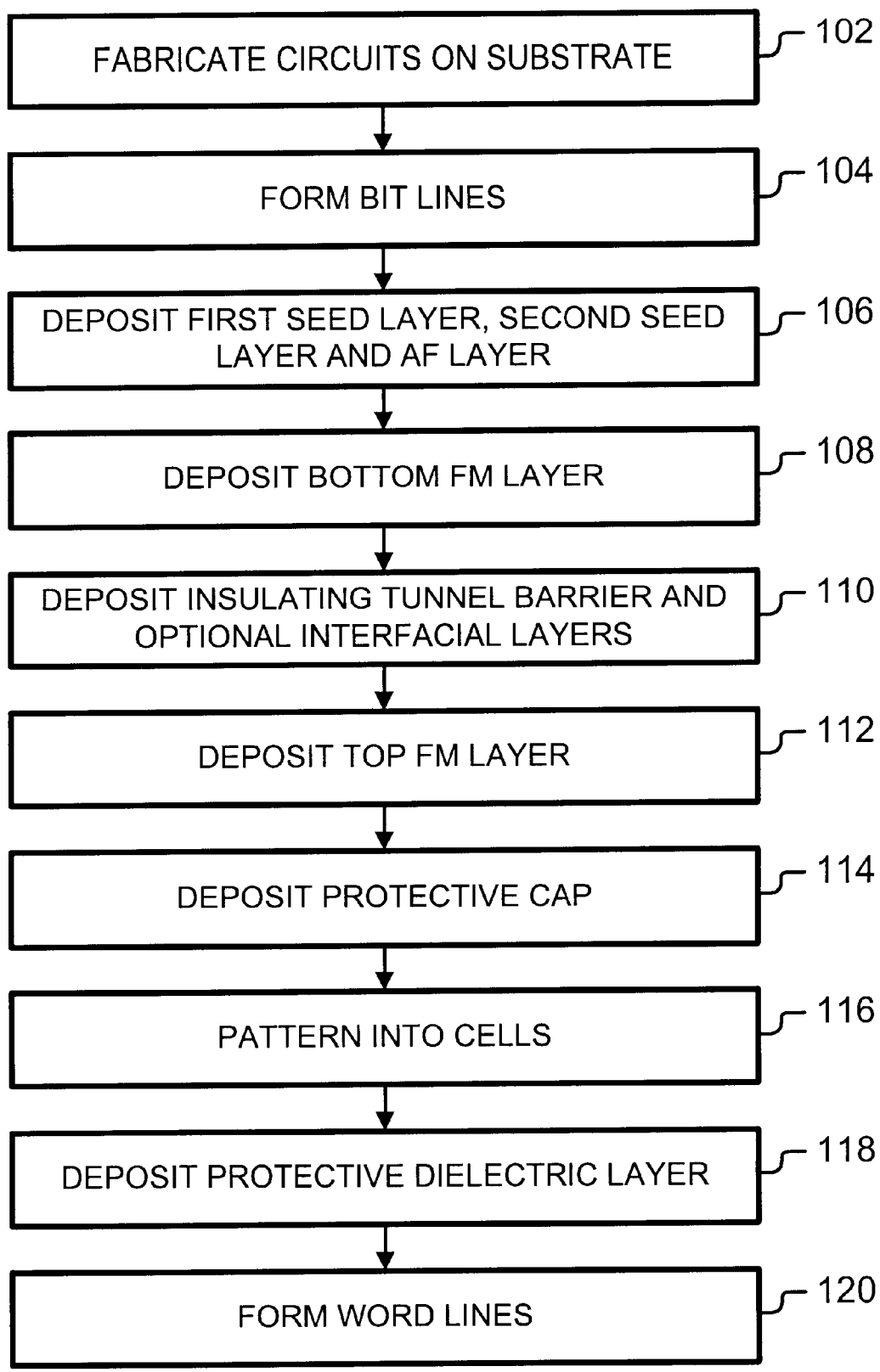

METHOD FOR IMPROVING BREAKDOWN VOLTAGE IN MAGNETIC TUNNEL JUNCTIONS

BACKGROUND OF THE INVENTION

The present invention relates to magnetic tunnel junctions such as spin dependent tunneling ("SDT") junctions. The present invention also relates to information storage devices such as Magnetic Random Access Memory ("MRAM") devices.

A typical MRAM device includes an array of memory cells, word lines extending along rows of the memory cells, and bit lines extending along columns of the memory cells. Each memory cell is located at a cross point of a word line and a bit line.

In one type of MRAM device, each memory cell includes an SDT junction. The magnetization of an SDT junction assumes one of two stable orientations at any given time. These two stable orientations, parallel and anti-parallel, represent logic values of '0' and '1.' The magnetization orientation, in turn, affects the resistance of the SDT junction. Resistance of the SDT junction is a first value (R) if the magnetization orientation is parallel and a second value (R+ΔR) if the magnetization orientation is anti-parallel. The magnetization orientation of a SDT junction and, therefore, its logic state may be read by sensing its resistance state.

The SDT junctions can be shorted by electrostatic discharge, handling errors (during manufacture) and circuit anomalies such as voltage spikes. Each shorted SDT junction can cause a bit error.

In a resistive cross point array that does not use switches or diodes to isolate memory cells from one another, a shorted SDT junction can also render other memory cells in the same column and row unusable. Thus, a single shorted SDT junction can cause column-wide and row-wide errors as well.

When data is read back from the MRAM device, error code correction may be used to recover data from a complete rows and columns of unusable SDT junctions. However, correcting a thousand or more bits in a single column or row is costly, both from a time standpoint and a computational standpoint. Moreover, an MRAM device is likely to have more than one shorted SDT junction.

If an MRAM device contains too many unusable SDT junctions, that device is rejected at the manufacture stage. Thus, electrostatic discharge, handling errors and circuit anomalies can reduce manufacturing yield.

It would be desirable to prevent damage resulting from handling errors and circuit anomalies. It would also be desirable to prevent damage resulting from electrostatic discharge. However, prevention against electrostatic discharge is expensive and difficult to implement.

SUMMARY OF THE INVENTION

According to one aspect of the present invention, a magnetic tunnel junction includes a tunnel barrier having base material that is partially processed (e.g., underoxidized, undernitrided). The partially processed base material substantially increases breakdown voltage of the junction. Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 4 is an illustration of a method of fabricating the MRAM device.

DETAILED DESCRIPTION OF THE INVENTION

Figure 1:
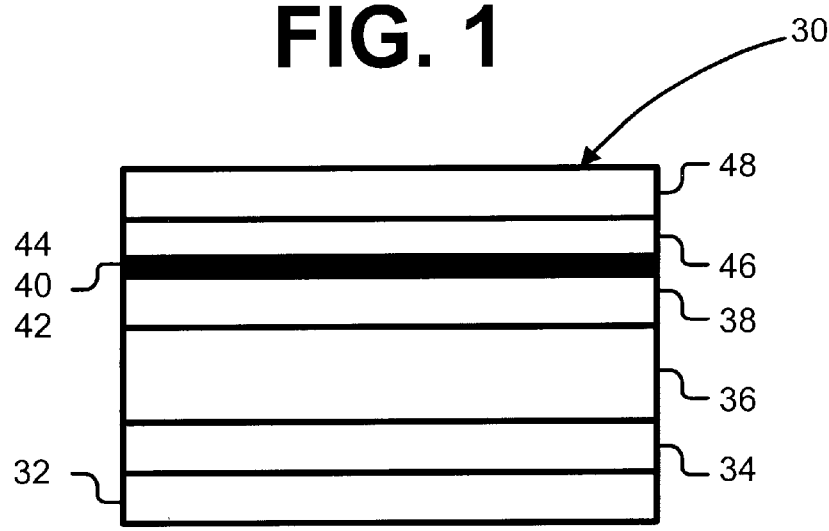
FIG. 1 is an illustration of an SDT junction including a tunnel barrier having partially processed base material.

As shown in the drawings for purposes of illustration, the present invention is embodied in an SDT junction including a tunnel barrier having partially processed base material. The partially processed base material substantially increases the breakdown voltage and reduces the chances of damage due to electrostatic discharge, handling errors and circuit anomalies. The higher breakdown voltage improves the robustness of the SDT junctions, improves manufacturing yield and reduces the cost of correcting bit errors These SDT junctions may be used in MRAM devices.

Referring to FIG. 1, an SDT junction 30 includes a multi-layer stack of materials. The stack includes first and second seed layers 32 and 34. The first seed layer 32 allows the second layer 34 to be grown with a (111) crystal structure orientation. The second seed layer 34 establishes a (111) crystal structure orientation for a subsequent antiferromagnetic ("AF") pinning layer 36. The AF pinning layer 36 provides a large exchange field, which holds the magnetization of a subsequent pinned (bottom) ferromagnetic ("FM") layer 38 in one direction. Atop the pinned FM layer 38 is an insulating tunnel barrier 40 having partially processed base material. Optional interfacial layers 42 and 44 may sandwich the insulating tunnel barrier 40. Atop the insulating tunnel barrier 40 is a sense (top) FM layer 46 having a magnetization that is free to rotate in the presence of an applied magnetic field. A protective capping layer 48 is atop the sense FM layer 46.

The pinned layer 38 has a magnetization that is oriented in a plane, but fixed so as not to rotate in the presence of an applied magnetic field in a range of interest. The sense layer 46 has a magnetization orientation that is not pinned. Rather, the magnetization can be oriented in either of two directions along an axis (the "easy"axis). If the magnetization of the pinned and sense layers 38 and 46 are in the same direction, the orientation is parallel. If the magnetization of the pinned and sense layers 38 and 46 are in opposite directions, the orientation is anti-parallel.

The insulating tunnel barrier 40 allows quantum mechanical tunneling to occur between the pinned and sense layers 38 and 46. This tunneling phenomenon is electron spin dependent, making the resistance of the SDT junction 30 a function of the relative orientations of the magnetization of the free and pinned layers 38 and 46.

For instance, resistance of an SDT junction 30 is a first value (R) if the magnetization orientation of the pinned and sense layers 38 and 46 is parallel. Resistance of the memory cell 12 is increased to a second value (R+ΔR) if the magnetization orientation is changed from parallel to anti-parallel. A typical first value (R) may be about one megaohms.

The first seed layer 32 and the protective capping layer 48 may be made of titanium (Ti) or tantalum (Ta), and the second seed layer 34 may be made of nickel-iron (NiFe). The AF pinning layer 36 may be made of manganese-iron (MnFe), nickel manganese (NiMn), nickel oxide (NiO) or iridium-manganese (IrMn). The FM layers 38 and 46 may be made of NiFe, or iron oxide ($Fe_3O_4$), or chromium oxide ($CrO_2$) or cobalt alloys (e.g., CoFe), or other ferromagnetic or ferrimagnetic materials. The interfacial layers 42 and 44 may be made of iron (Fe). Other materials may be used for the interfacial layers 42 and 44, although a high spin polarized material is desirable.

The base material of the insulating tunnel barrier 40 may be, for example, aluminum, boron, hafnium, magnesium, silicon, tantalum or tungsten. When processed, these base materials are oxidized or nitrided into aluminum oxide ($Al_2O_3$), aluminum nitride (AlN), boron nitride (BN), hafnium oxide ($HfO_2$), magnesium oxide (MgO), silicon dioxide ($SiO_2$), silicon nitride ($SiN_4$), tantalum oxide ($Ta_2O_5$), and tungsten oxide ($WO_2$, $WO_3$).

The insulating tunnel barrier 40 may be formed by underprocessing the base material. For example, the base material is deposited and then processed by exposure to either nitrogen or oxygen, by a remote plasma (low energy oxygen or nitrogen ions), by a full plasma, or by an ion beam method.

If formed by underprocessing, the tunnel barrier 40 may be oxidized or nitrided from the top down. Therefore, density of the partially processed base material is substantially higher at the bottom surface of the tunnel barrier 40 than at the top surface.

In the alternative, the insulating tunnel barrier 40 may be formed by depositing a layer of unprocessed base material and depositing fully processed base material on the layer of unprocessed base material. For example, a thin layer (1–2 angstroms) of the unprocessed base material is sputtered and then an oxide or nitride is then r-f deposited on top.

The insulating tunnel barrier 40 has unprocessed base material in traces that are sufficient to substantially increases the breakdown voltage of the SDT junction 30 and reduce the tunneling magnetoresistance (TMR), where TMR=$\Delta R/R$. If the tunnel barrier 40 is formed by underprocessing, the desirable amount of unprocessed base material can be indicated by TMR of the SDT junction 30 and it can be controlled by reducing oxidation or nitridation time.

For example, an SDT junction having a fully processed tunnel barrier might have a TMR of about 30% to 40% and a breakdown voltage of between 1.75 volts and 2 volts. In contrast, the SDT junction 30 might have a TMR between 13% and 20% but a breakdown voltage between 4 volts and 4.5 volts.

These differences are illustrated by the following three samples that were fabricated. A first sample of an SDT junction was fabricated by depositing a 5 nm first seed layer of Ta on a cleaned wafer, followed by a 6 nm second seed layer of NiFe, a 10 nm AF layer of MnFe, a 4 nm bottom FM layer of NiFe, an $Al_2O_3$ insulating tunnel barrier, a 4 nm top FM layer of NiFe, and a 5 nm protective capping layer of Ta. The insulating tunnel barrier was formed by depositing a 1.25 nm layer of aluminum and then oxidizing the deposited aluminum by plasma oxidation for 150 seconds. Junction size was 5 microns×10 microns. The first sample had a breakdown voltage of about 2 volts and a TMR of about 30%.

A second sample was prepared in the same manner as the first sample, except that the tunnel barrier was oxidized for 120 seconds. The second sample had a breakdown voltage of about 4 volts and a TMR of about 20%.

A third sample was prepared in the same manner as the first sample, except that the tunnel barrier was oxidized for 90 seconds. The third sample had a breakdown voltage of about 4.5 volts and a TMR of about 13%.

Figure 2:
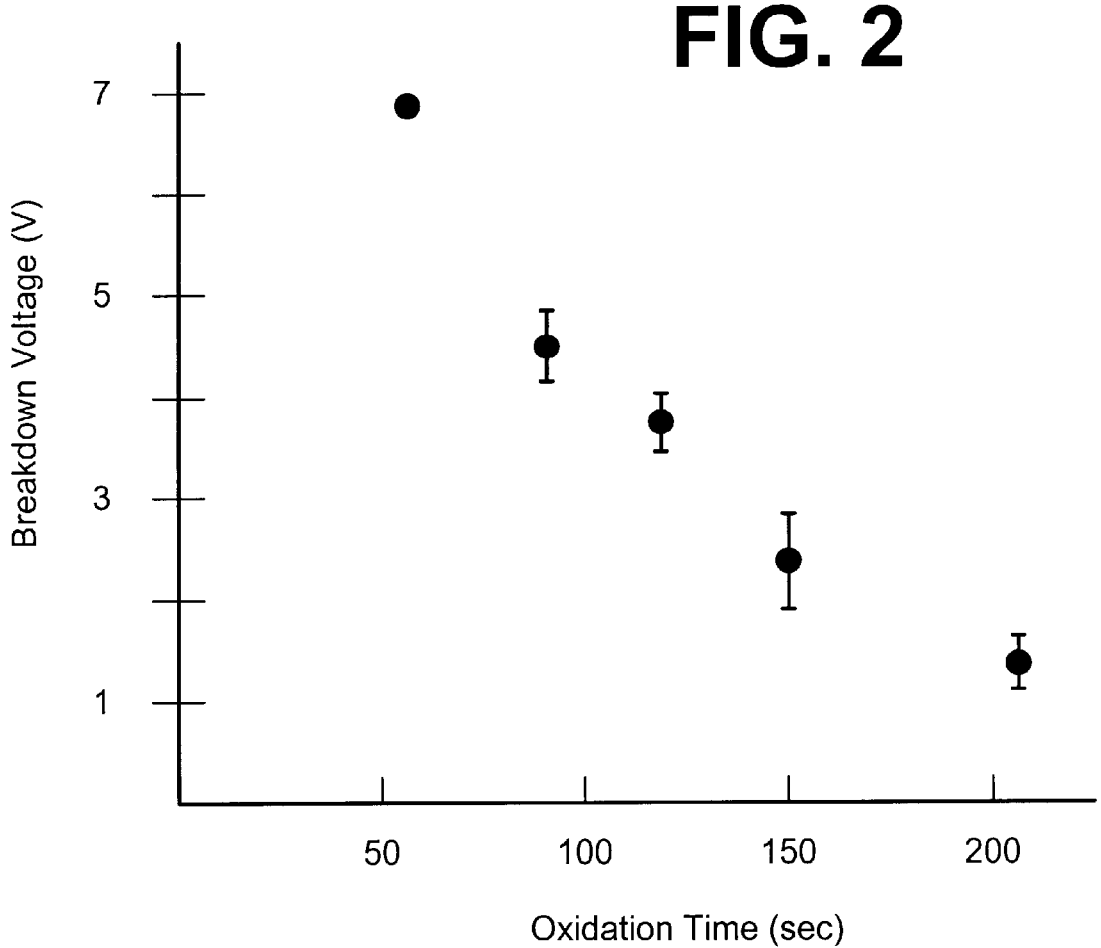
FIG. 2 is a plot of breakdown voltage versus oxidation time for SDT junctions having aluminum oxide tunnel barriers.

FIG. 2 shows a plot of breakdown voltage versus oxidation time for an SDT junction having an aluminum oxide tunnel barrier. The circles indicate the mean, and the bars represent the standard deviation. Exact times required for oxidation were dependent on the experimental equipment used to produce the samples, the voltage of the plasma, the pressure of the gas, the proximity of the plasma to the wafer, etc.

Figure 3:
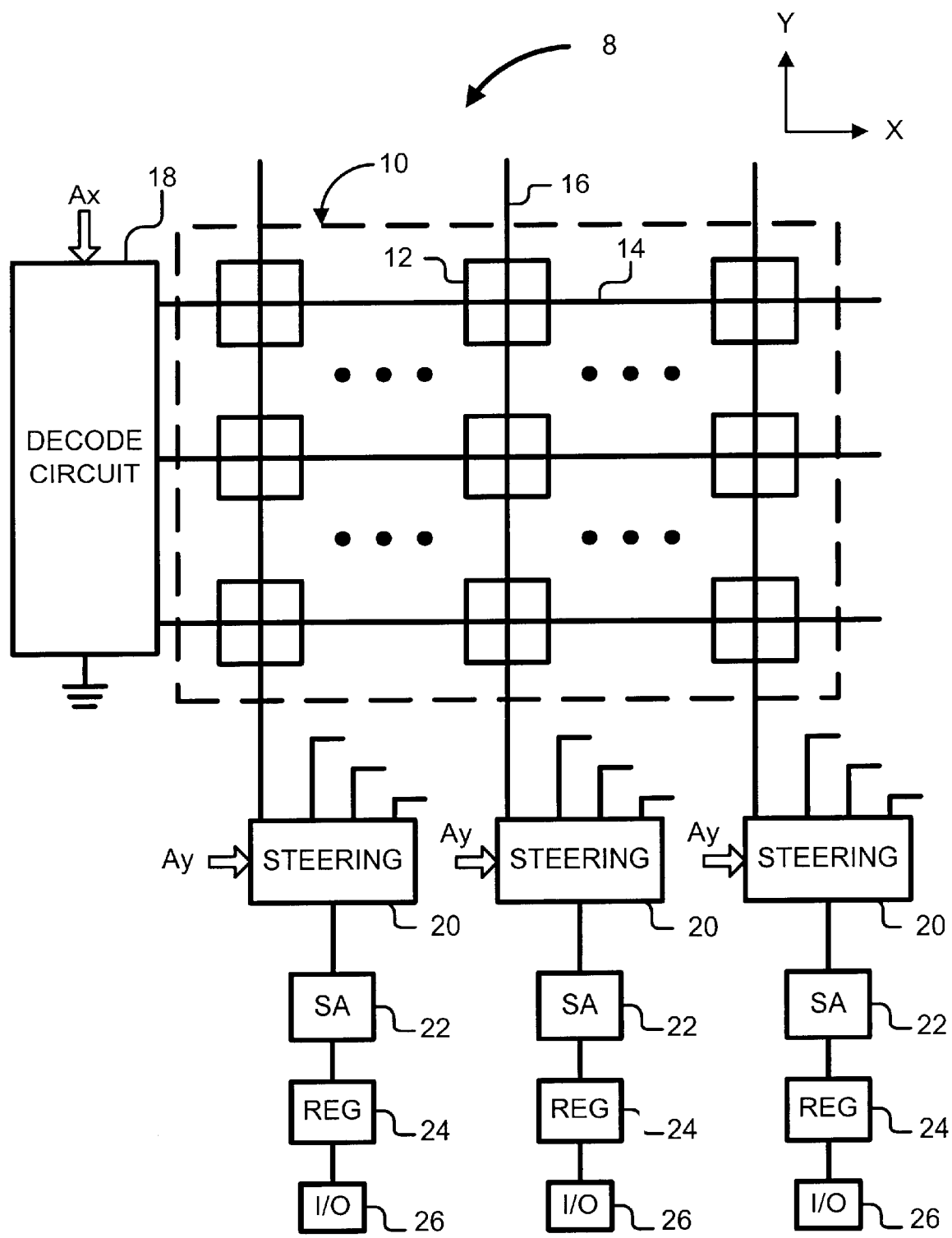
FIG. 3 is an illustration of an MRAM device including SDT junctions having partially processed base material in their tunnel junctions.

Reference is now made to FIG. 3, which illustrates an MRAM device 8 including an array 10 of SDT junction memory cells 12. The memory cells 12 are arranged in rows and columns, with the rows extending along an x-direction and the columns extending along a y-direction. Only a relatively small number of memory cells 12 are shown to simplify the description of the device 8. In practice, arrays of any size may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a cross point of a word line 14 and bit line 16.

The MRAM device 8 also includes a row decoder 18 for selecting word lines 14 during read and write operations. A word line 14 may be selected during a read operation by connecting that word line 14 to ground The MRAM device 8 also includes a steering circuit 20 and a read/write circuit 22 for each group (e.g., sixteen) of columns. The read/write 22 circuit senses resistance of selected memory cells 12 during read operations and it orients the magnetization of the selected memory cells 12 during write operations. Each read/write circuit 22 is coupled to a device I/O pad 26 via a register 24.

The MRAM device 8 may use diodes or switches for blocking sneak path currents during read operations. In the alternative, the MRAM device 8 may block the sneak path currents via the equipotential method disclosed in assignee's U.S. Ser. No. 09/564308 filed Mar. 3, 2000.

The MRAM device 8 may include multiple levels of arrays. The levels may be stacked on a substrate and separated by insulating material (not shown) such as silicon dioxide. Read/write circuits may be fabricated on the substrate. The read/write circuits may include additional multiplexers for selecting the levels that are read from and written to.

FIG. 4 shows a method of manufacturing the MRAM device 8. Read/write circuits, row decoders and other circuits are fabricated on a substrate (block 102). Conductor material is then deposited onto the substrate and patterned into bit lines (block 104). The bit lines 16 (and subsequently the word lines 14) may be made of conductive materials such as copper, aluminum or gold or alloys thereof. A dielectric may then be deposited between the bit lines. The first seed layer, the second seed layer and the AF layer are deposited in seriatim (block 106). The bottom FM layer is deposited over the AF layer (block 108).

An optional bottom interfacial layer may then be deposited, followed by the insulating tunnel barrier having partially processed base material (block 110). An optional top interfacial layer may be deposited on the insulating tunnel barrier (block 110).

The top FM layer is then deposited (block 112). The protective capping layer is deposited on the upper FM layer (block 114).

The resulting stack is then patterned into cells (block 118). Patterning may be performed by depositing a layer of photo-resist on the protective capping layer, using photolithography to pattern the photo-resist, and removing material not protected by the photo-resist. Vias may also be milled in order to establish connections with the underlying circuitry.

A thin layer of dielectric is then formed on the patterned structures (block 118). The dielectric, which fills in spaces between the patterned structures, prevents short circuits between edges of magnetic films. It also prevents conductors from shorting. Openings for word line connections are then formed in the dielectric. Conductor material is then deposited on the dielectric and patterned into word lines (block 120).

The resulting array may then be planarized. A new array may be formed atop the planarized array.

These blocks 102 to 120 describe the manufacture of a single MRAM device. In practice, however, many MRAM devices are fabricated simultaneously on a single wafer.

Although signal is sacrificed, the SDT junctions are more robust. The more robust SDT junctions are more likely to survive electrostatic discharge, handling errors and circuit anomalies. Consequently, manufacturing yield is improved and the cost of correcting shorted bits is reduced.

The SDT junctions are especially useful for high voltage applications. High voltage applications may include flat emitter devices, high-current devices, and devices having materials that have high polarization at energies above the Fermi energy (these high-voltage devices would be operated at the corresponding voltage to the peak in spin polarization).

Although a specific configuration for the SDT junction of FIG. 1 has been disclosed, the SDT junction is not so limited. Other configurations may be used. For example, a hard magnet or a synthetic antiferromagnet may be used instead of the AF pinning layer. The AF pinning layer may be placed near the top of the stack instead of the bottom of the stack, whereby the top FM layer is the pinned layer and the bottom FM layer is the sense layer.

The base material of the tunnel barrier is not limited to the materials described above. Other dielectrics and certain semiconductor materials may be used for the insulating tunnel barrier.

Although the magnetic tunnel junctions have been described as SDT junctions, they are not so limited. For example, the magnetic tunnel junctions may be Josephson junctions.

The present invention is not limited to the specific embodiments described and illustrated above. Instead, the present invention is construed according to the claims that follow.

What is claimed is:

1. A magnetic tunnel junction comprising a tunnel barrier having partially processed base material, the partially processed base material substantially increasing breakdown voltage of the junction.

2. The junction of claim 1, wherein the partially processed base material is underoxidized.

3. The junction of claim 1, wherein the partially processed base material is undernitrided.

4. The junction of claim 1, wherein density of the base material at a first surface of the tunnel barrier is substantially lower than density of the base material at a second surface of the tunnel barrier.

5. The junction of claim 1, wherein the partially processed base material increases the breakdown voltage by at least twice the breakdown voltage of a junction having fully processed base material.

6. The junction of claim 1, wherein the magnetic tunnel junction is a spin dependent tunneling junction.

7. A Magnetic Random Access Memory device comprising an array of memory cells including magnetic tunnel junctions, the magnetic tunnel junctions including tunnel barriers having partially processed base material.

8. The device of claim 7, wherein the partially processed base material is underoxidized.

9. The device of claim 7, wherein the partially processed base material is undernitrided.

10. The device of claim 9, wherein density of the base material at first surfaces of the tunnel barriers is substantially lower than density of the base material at second surfaces of the tunnel barriers.

11. The device of claim 10, wherein the first surfaces are top surfaces of the barriers and the second surfaces are bottom surfaces of the tunnel barriers.

12. The device of claim 7, wherein the partially processed base material increases the breakdown voltage by at least twice the breakdown voltage of junctions having fully processed base materials.

13. The device of claim 7, wherein the magnetic tunnel junctions are spin dependent tunneling junctions.

* * * * *